(12) United States Patent
Miki et al.

(10) Patent No.: US 9,104,103 B2
(45) Date of Patent: Aug. 11, 2015

(54) INFORMATION RECORDING MEDIUM AND METHOD OF MANUFACTURING THE SAME

(75) Inventors: Takeo Miki, Machida (JP); Takashi Yamaguchi, Kawasaki (JP); Kenji Miyazaki, Komae (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 637 days.

(21) Appl. No.: 12/402,749

(22) Filed: Mar. 12, 2009

(65) Prior Publication Data

US 2009/0236546 A1    Sep. 24, 2009

(30) Foreign Application Priority Data

Mar. 18, 2008   (JP) ................ 2008-070047

(51) Int. Cl.

| | |
|---|---|
| *G06K 19/00* | (2006.01) |
| *G03F 7/012* | (2006.01) |
| *G03H 1/00* | (2006.01) |
| *G03H 1/26* | (2006.01) |
| *G06K 19/16* | (2006.01) |
| *B42D 25/328* | (2014.01) |
| *G03H 1/02* | (2006.01) |

(52) U.S. Cl.
CPC .............. *G03F 7/012* (2013.01); *B42D 25/328* (2014.10); *G03H 1/0011* (2013.01); *G03H 1/26* (2013.01); *G06K 19/16* (2013.01); *B42D 2033/14* (2013.01); *B42D 2035/50* (2013.01); *G03H 1/0244* (2013.01); *G03H 2001/0016* (2013.01); *G03H 2001/0264* (2013.01); *G03H 2001/2635* (2013.01); *G03H 2210/22* (2013.01); *G03H 2250/39* (2013.01); *G03H 2260/35* (2013.01)

(58) Field of Classification Search
USPC ................ 235/435, 439, 454, 462; 430/270.1
See application file for complete search history.

(56) References Cited

U.S. PATENT DOCUMENTS

| | | | |
|---|---|---|---|
| 2003/0156523 A1* | 8/2003 | Wu et al. | 369/103 |
| 2005/0007944 A1* | 1/2005 | Uchiyama et al. | 369/275.5 |
| 2005/0208387 A1* | 9/2005 | Minabe et al. | 430/1 |
| 2005/0242324 A1* | 11/2005 | Fukuda et al. | 252/299.01 |

FOREIGN PATENT DOCUMENTS

| | | |
|---|---|---|
| JP | 07-320014 | 12/1995 |
| JP | 2002-074665 | 3/2002 |

* cited by examiner

*Primary Examiner* — Matthew Mikels
(74) *Attorney, Agent, or Firm* — Oblon, McClelland, Maier & Neustadt, L.L.P.

(57) ABSTRACT

An information recording medium manufacturing method includes steps of forming, on a support, a recording layer containing a polymer compound having an azobenzene structure, irradiating the recording layer with first writing light to form a first light-diffracting structure having a three-dimensional relief pattern on the surface of the recording layer, fixing the relief pattern by forming a deformation preventing layer on the surface of the recording layer, and irradiating the recording layer having the fixed relief pattern with second writing light to forcedly inhibit deformation caused by the movement of molecules, thereby forming a second light-diffracting structure having a refractive index change inside the recording layer.

15 Claims, 4 Drawing Sheets

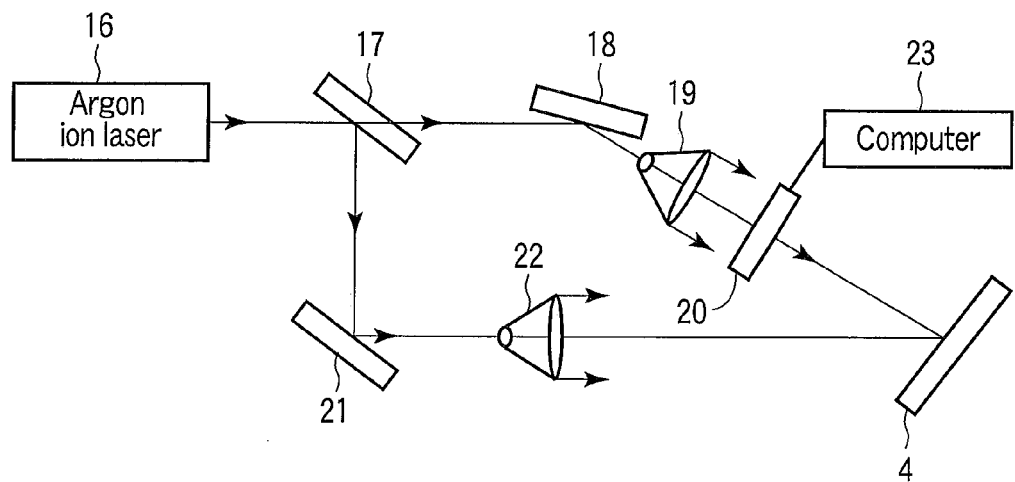
F I G. 6
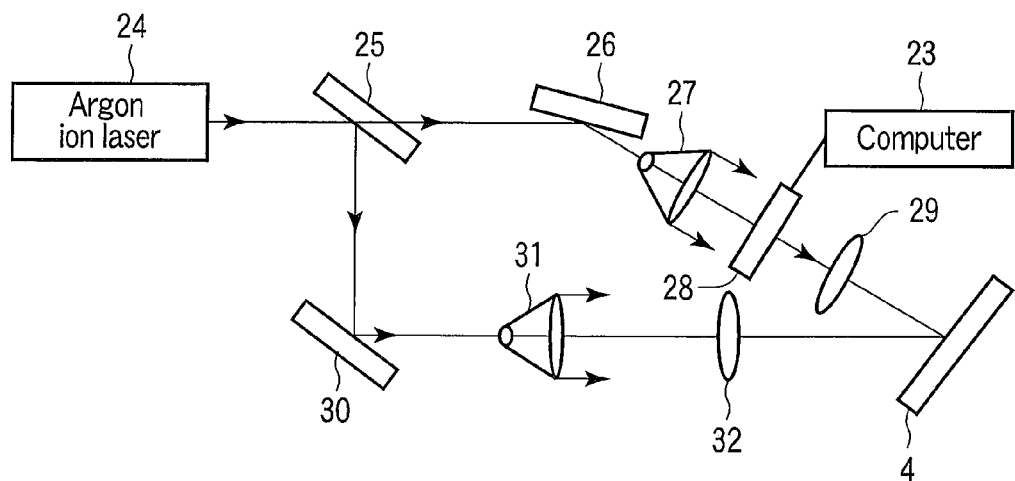
F I G. 7

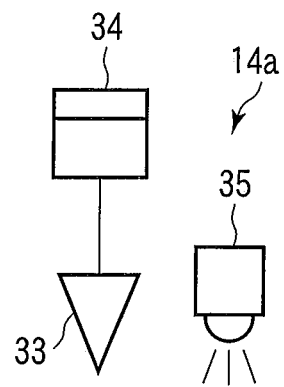
F I G. 8
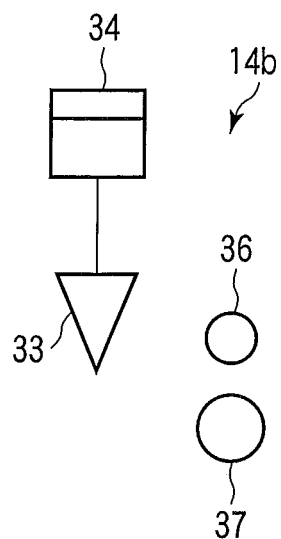
F I G. 9

INFORMATION RECORDING MEDIUM AND METHOD OF MANUFACTURING THE SAME

CROSS-REFERENCE TO RELATED APPLICATIONS

This application is based upon and claims the benefit of priority from prior Japanese Patent Application No. 2008-070047, filed Mar. 18, 2008, the entire contents of which are incorporated herein by reference.

BACKGROUND OF THE INVENTION

1. Field of the Invention

The present invention relates to an information recording medium usable as a personal authentication medium such as a license, credit card, or membership card, and a method of manufacturing the same.

2. Description of the Related Art

Various forgery/alteration preventing means are conventionally used in personal authentication media such as a license, credit card, and membership card. For example, a rainbow hologram that is a relief hologram having a metal reflecting layer is formed on the surface of a credit card as a structure for visually determining the authenticity of the card. Since this rainbow hologram formed on the card can optically be forged, demands have arisen for an advanced technique as a forgery preventing means.

Under the circumstances, Japanese Patent No. 3563774, for example, has disclosed an information recording medium in which a region having a first light-diffracting structure from which recorded information can mechanically be read and a region having a second light-diffracting structure from which recorded information can visually be read are alternately formed in a single light-diffracting structure formation layer so as not to superpose each other. When the first light-diffracting structure is a hologram from which recorded information can be read with only highly coherent light, it is visually difficult to perceive that optically readable information is recorded. This makes forgery difficult. Furthermore, when the second light-diffracting structure is a hologram from which recorded information can visually be read with white-light illumination, no special apparatus is necessary in visual authentication. Also, since the first and second light-diffracting structures do not superpose each other, no cloudiness occurs due to superposition of the two light-diffracting structures. Accordingly, operation errors hardly occur during mechanical reading. However, both the first and second light-diffracting structures contain permanent information, so the medium can easily be duplicated if the recorded information is revealed.

On the other hand, when a thin film of a polymer compound containing an azobenzene structure is directly irradiated with linearly polarized light, a photo-excited molecular reorientation phenomenon forms a thin birefringent film in which the molecular principal axis is oriented perpendicularly to the electric field vector of the irradiating light. This birefringence is attracting attention because it can be erased when irradiated with circularly polarized light and hence can be used as a rewritable hologram memory. This is described in, e.g., Opt. Commun., Vol. 47, (1983), p. 123 and Applied Physics Society Journal, Applied Physics, Vol. 75, No. 10, (2006), pp. 1,252-1,254. When the polymer compound containing an azobenzene structure is applied as a rewritable hologram to a forgery/alteration preventing means, variable information can be recorded instead of permanent information. This can make duplication difficult. Since information is rewritable, however, if visually readable information is rewritten, the information cannot visually be distinguished from authentic information. This makes the medium vulnerable to alteration.

Furthermore, when the application energy or application time of a laser beam is made higher or longer than that when forming the birefringence on the thin film of the polymer compound containing an azobenzene structure, a three-dimensional pattern is formed on the surface in accordance with the polarized state of the laser. As described in, e.g., Jpn. Pat. Appln. KOKAI Publication No. 2002-74665, this pattern can be erased by applying uniform light having a different wavelength or by heating. Accordingly, attempts have been made to apply a rewritable hologram to a high-density optical information recording method or the like.

BRIEF SUMMARY OF THE INVENTION

The present invention has been made in consideration of the above situation, and has as its object to provide an information recording medium that is hardly forged and altered.

An information recording medium manufacturing method of the present invention comprising:

forming, on a support, a recording layer containing a polymer compound having an azobenzene structure;

irradiating the recording layer with first writing light to move molecules of the polymer compound having the azobenzene structure for deforming the recording layer and forming a first light-diffracting structure having a three-dimensional shape on a surface of the recording layer;

fixing the three-dimensional shape by forming a deformation preventing layer on the surface of the recording layer; and irradiating the recording layer having the fixed three-dimensional shape with second writing light, thereby forming a second light-diffracting structure having a refractive index change inside the recording layer.

An information recording medium of the present invention comprises a support, a recording layer formed on the support and containing a polymer compound having an azobenzene structure, a first light-diffracting structure having a three-dimensional shape being formed on a surface of the recording layer, and a second light-diffracting structure having a refractive index change being formed inside the recording layer, and a deformation preventing layer formed on the recording layer to fix the three-dimensional shape.

An information recording medium that is hardly forged or altered can be obtained by using the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a schematic view showing an example of a relief pattern formation mechanism shown in FIG. 4;

FIG. 7 is a schematic view showing an example of a refractive index change formation mechanism shown in FIG. 4;

FIG. 8 is a schematic view showing an example of a deformation preventing layer formation mechanism shown in FIG. 4; and FIG. 9 is a schematic view of another example of the deformation preventing layer formation mechanism shown in FIG. 4.

DETAILED DESCRIPTION OF THE INVENTION

Figure 1:
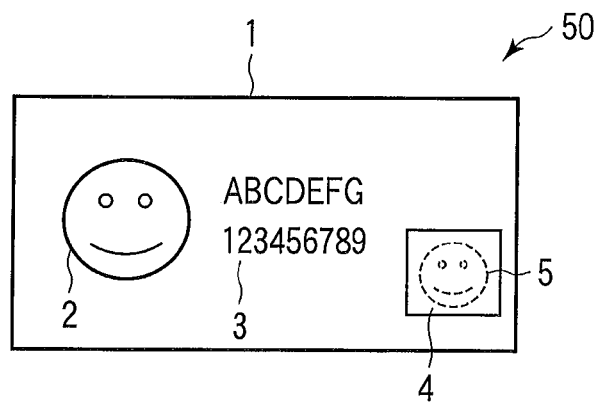
FIG. 1 is a front view of an ID card as an example of a personal authentication medium to which an information recording medium according to the present invention is applicable.

An information recording medium manufacturing method of the present invention includes steps of forming, on a support, a recording layer containing a polymer compound having an azobenzene structure, irradiating the recording layer with first writing light to deform the recording layer by moving molecules of the polymer compound having an azobenzene structure, thereby forming a first light-diffracting structure having a three-dimensional shape on the surface of the recording layer, and forming a second light-diffracting structure by irradiating the recording layer with second writing light, wherein the three-dimensional shape as the first light-diffracting structure is fixed by forming a deformation preventing layer on the surface of the recording layer before the recording layer is irradiated with the second writing light, so the second light-diffracting structure having a refractive index change can be formed inside the recording layer by inhibiting deformation caused by the movement of molecules of the polymer compound having an azobenzene structure when the second writing light is applied.

In the present invention, a polymer compound having an azobenzene structure represented by formula (1) below is used as the recording layer. Also, the present invention uses the characteristics of this compound.

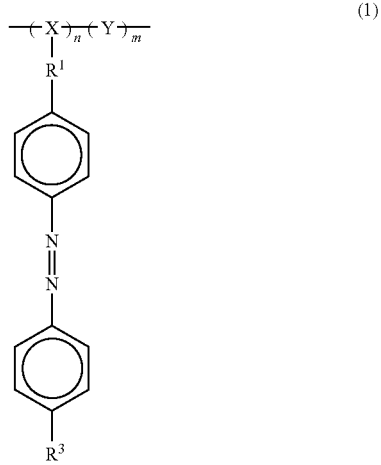

(1)

(wherein R1 is an electron releasing group, R3 is an electron withdrawing group, each of X and Y is another constituent element that forms a single bond or polymer chain, and each of m and n is an integer of 1 or more).

When the surface of the thin film of the polymer compound having an azobenzene structure is irradiated with light having a wavelength equivalent to the absorption band of the polymer compound, e.g., light having a wavelength of 515 to 458 nm such as an argon laser, a portion having the azobenzene structure repeats conversion to an isomer. That is, the azobenzene structure repetitively changes from a trans isomer to a cis isomer and vice versa as represented by formulas below. Consequently, the polymer chain moves in accordance with the geometrical shape and polarized state of a laser beam, and a three-dimensional pattern is formed on the surface. This three-dimensional pattern will be referred to as a relief pattern hereinafter.

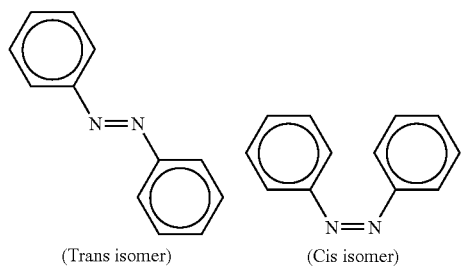

(Trans isomer)        (Cis isomer)

This phenomenon is as follows. When the thin film of the polymer compound containing an azobenzene structure is irradiated with an optical pattern, the surface portion senses the intensity of the light, and molecules move from a high-intensity portion to a low-intensity portion, thereby forming a three-dimensional shape. The three-dimensional shape thus formed on the surface can be erased by applying light having another wavelength or by heating. It also possible to accurately record the shape and polarized state of a beam on the three-dimensional structure, and reproduce them from it.

The refractive index change formed as the second light-diffracting structure inside the recording layer occurs when those molecules of the polymer compound having an azobenzene structure, which are forcedly inhibited from moving, point in the direction of an electric field.

The information recording medium of the present invention is one information recording medium formed by the above manufacturing method, and includes a support, a recording layer formed on the support and containing a polymer compound having an azobenzene structure, and a deformation preventing layer formed on the recording layer.

The recording layer has a first light-diffracting structure on the surface, and a second light-diffracting structure in the interior. The "surface" herein mentioned is a surface opposite to a surface facing the support. In other words, this surface is the interface between the deformation preventing layer and recording layer.

The first light-diffracting structure is characterized by a shape, i.e., a relief pattern. This relief pattern is obtained by moving molecules in the polymer compound having an azobenzene structure by irradiating the compound with first writing light, thereby deforming the recording layer. The first light-diffracting structure is unrewritable as it is fixed by the deformation preventing layer.

The second light-diffracting structure is characterized by a physical property, i.e., a refractive index change. This refractive index change is produced by forcedly inhibiting the movement of molecules in the polymer compound having an azobenzene structure by irradiating the compound with second writing light, thereby changing the direction of the molecules in the recording layer in accordance with the second writing light. Accordingly, the second light-diffracting structure has no shape feature. The second light-diffracting structure can be rewritten by further applying the second writing light.

In the present invention as described above, the polymer compound having an azobenzene structure is used as the recording layer and irradiated with the first writing light, thereby forming the relief pattern on the surface of the recording layer by using the physical property of the polymer compound having an azobenzene structure. In addition, the deformation preventing layer is formed on the relief pattern to fix the shape, and the second writing light is applied to forcedly inhibit the movement of molecules and deformation caused by the molecular movement, thereby changing only the direction of the molecules. This makes it possible to produce a refractive index change corresponding to the second writing light in the recording layer.

The relief pattern can be used as visually readable unrewritable information, and the refractive index change can be used as mechanically readable rewritable information. The information recording medium thus obtained is hardly forged or altered.

Highly coherent light can be used as the first writing light. Hologram recording can be performed on the recording layer by using coherent light.

The first light-diffracting structure can be a hologram or diffraction grating that can visually be read when irradiated with white light.

Highly coherent light can be used as the second writing light. Hologram recording can be performed on the recording layer by using coherent light.

The second light-diffracting structure can be a hologram or diffraction grating that can be read with highly coherent light.

The present invention will be explained in more detail below with reference to the accompanying drawing.

FIG. 1 is a front view of an ID card as an example of a personal authentication medium to which the information recording medium according to the present invention is applicable.

As shown in FIG. 1, a color face image 2 of the holder of the ID card and character information 3 such as the name, date of birth, and ID number of the holder are printed on a card substrate 1 of an ID card 50, and an information recording medium 4 according to the present invention is adhered to a portion of a region except for the region where the color face image 2 and character information 3 are recorded. Note that the information recording medium 4 is adhered as a seal on the card substrate 1 in this embodiment, but the recording layer, deformation preventing layer, and the like used in the present invention may also be directly formed by using the card substrate as a support. The information recording medium 4 has an image obtained by downsizing the face image of the holder, as a visually readable hologram 5. The visually readable hologram 5 is a hologram formed by a relief pattern. The color face image 2 is formed by, e.g., a sublimation heat transfer printing method. The color face image 2 may also be formed by various printing methods such as an inkjet printing method. The character information 3 can be formed by, e.g., a melting heat transfer printing method. The character information 3 may also be formed by various printing methods such as an inkjet printing method.

Figure 2:
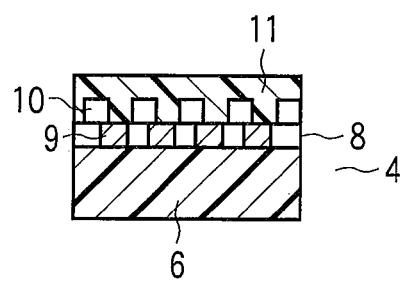
FIG. 2 is a schematic sectional view showing an example of the information recording medium of the present invention.

FIG. 2 is a schematic sectional view showing an example of the information recording medium of the present invention.

In this information recording medium as shown in FIG. 2, a recording layer 8 containing a polymer compound having an azobenzene structure and a deformation preventing layer 11 are sequentially formed on a substrate 6. The recording layer 8 containing the polymer compound having an azobenzene structure has a hologram 10 that is a visually readable three-dimensional relief pattern. The recording layer 8 also has a hologram 9 that is a visually unreadable, but mechanically readable refractive index change pattern.

The relief pattern hologram 10 is unrewritable because it is fixed by the deformation preventing layer 11, so azobenzene molecules cannot move even when irradiated with light. This makes alteration difficult.

On the other hand, the refractive index change pattern hologram 9 is rewritable because it is formed inside the recording layer 8, so nothing interferes with the formation of the hologram 9. For example, if the name of the holder or the valid period of the ID card has changed, the information of the refractive index change pattern hologram 9 can be rewritten. When a magnetic memory, IC memory or the like is formed in the ID card, the authenticity of the ID card can be determined by collating information stored in the memory with the information recorded in the hologram 9.

The second writing light can be applied not only from the side of the relief pattern hologram 10 but also from the side of the substrate 6. Therefore, the substrate 6 can be transparent in order to well transmit the second writing light.

The information recording medium 4 can be formed on the ID card 50 by applying, for example, an adhesive or the like on the surface of the substrate 6, and adhering the substrate 6 on the card substrate 1. Alternatively, the information recording medium 4 can be formed by using the card substrate 1 as the substrate 6.

A material usable as the deformation preventing layer 11 is required to be applicable on the relief pattern, and have hardness that can well inhibit the movement of molecules of the azobenzene polymer compound. The material can also have transparency with which it is well possible to visually recognize the relief pattern on the surface of the recording layer 8. A liquid material can be selected in order to apply the material on the relief pattern. As a liquid material that can readily be set after being applied, it is possible to use, e.g., a photo-setting resin or thermosetting resin.

Preferred examples of the thermosetting resin are an alkyd resin, amino-alkyd resin, epoxy resin-fatty acid ester, epoxy resin, polyurethane family, acrylic resin family, acrylic-urethane resin, vinyl resin family, fluorine resin family, polysiloxane family, and acryl-siloxane-based resin.

As the photo-setting resin, it is possible to use a resin which is made of a photo-setting oligomer, monomer, photoreaction initiator, body pigment, and other additives, and in which the photo-setting oligomer and monomer react with each other by photo-setting, thereby forming a three-dimensional network structure. As the photo-setting resin, it is possible to use, e.g., an ultraviolet-curing resin. An example of the ultraviolet-curing resin is (meta)acrylic ester of trifunctional or higher alcohol. Examples of this (meta)acrylic ester are pentaerythritol triacrylate, pentaerythritol trimethacrylate, pentaerythritol tetraacrylate, pentaerythritol tetramethacrylate, trimethylolpropane triacrylate, trimethylolpropane trimethacrylate, dipentaerythritol triacrylate, dipentaerythritol hexaacrylate, dipentaerythritol hexamethacrylate, dipentaerythritol pentamethacrylate, pentaerythritol polyacrylate, and dipentaerythritol polyacrylate.

A photoreaction initiator can be added to the ultraviolet-curing resin.

Examples of the photoreaction initiator are benzophenones, acetophenones, benzoins, thioxantons, azo compounds, Michler's ketone, benzyl, benzoinalkylether, benzyldimethylketal, and tetramethylthiuram monosulfide.

Figure 3:
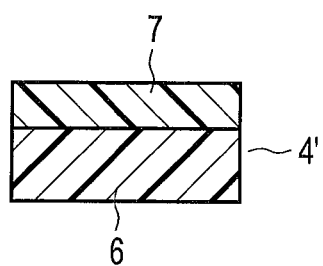
FIG. 3 is a schematic sectional view showing the state in which the information recording medium shown in FIG. 2 is unrecorded.

FIG. 3 is a schematic sectional view showing the state in which the information recording medium shown in FIG. 2 is unrecorded.

An unrecorded information recording medium 4' has a substrate 6 as a resin sheet, and an organic compound recording layer 7 formed on the substrate 6 and containing an azobenzene structure.

The substrate 6 may be the ID card substrate 1 or another resin sheet. When forming a refractive index change pattern (to be described later), writing light can be applied not from the surface on which the relief pattern hologram is formed but from the opposite surface. Therefore, the substrate 6 can be transparent. As the substrate 6, it is possible to use a resin sheet made of, e.g., polyvinyl chloride or a polyethyleneterephthalate resin. In this embodiment, a 50-μm thick polyethyleneterephthalate resin sheet was used.

The recording layer 7 can be formed by dissolving a polymer compound containing an azobenzene structure in a solvent such as chloroform or dichloromethane at a concentration of 1 to 30 mass %, and forming a thin film of the solution by, e.g., gravure printing, roll printing, or inkjet printing. The thickness of the recording layer 7 can properly be changed in accordance with the relief pattern, and can be set to, e.g., 1 to 5 μm.

Referring to FIG. 2, the pattern pitch of the relief pattern hologram 10 is 1 μm. Since the refractive index change pattern must be formed inside the recording layer, the thickness of the recording layer 7 can be set at 3 μm, i.e., a value three times as large as the pitch.

Examples of the polymer compound containing an azobenzene structure usable in the present invention are a compound represented by formula (2) below, and PVA (Polyvinyl Alcohol) formed by dispersing methyl orange.

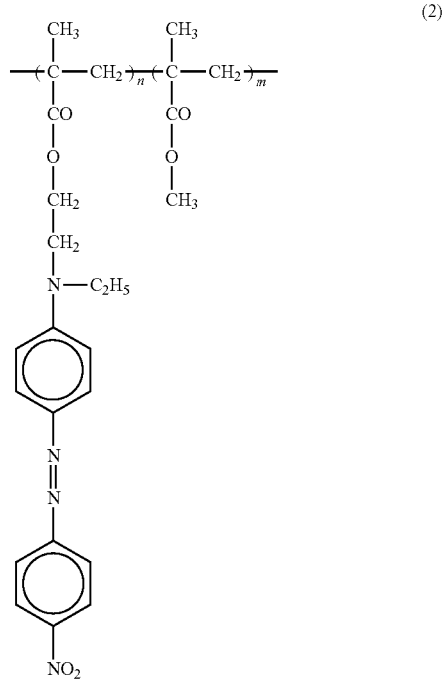

(2)

Figure 4:
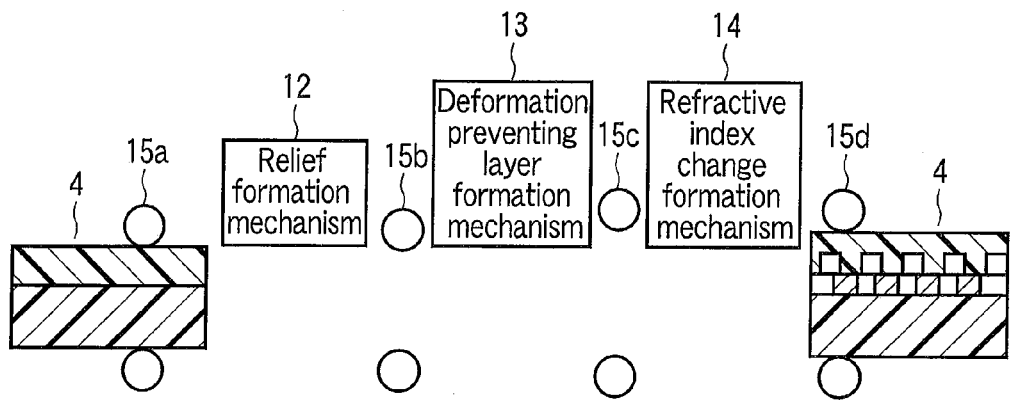
FIG. 4 is a schematic view of an example of an information recording apparatus to which the present invention is applicable.

FIG. 4 is a schematic view of an example of an information recording apparatus to which the present invention is applicable.

Figure 5:
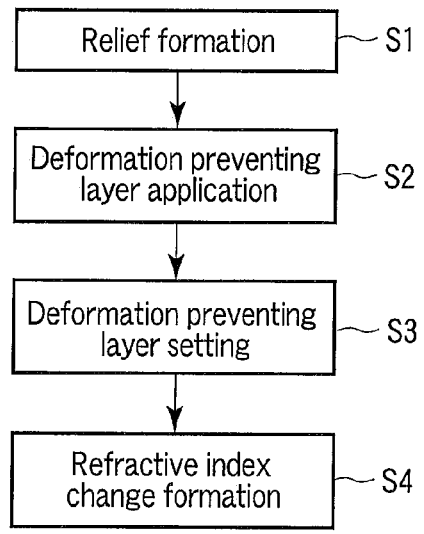
FIG. 5 is a schematic view of an example of an information recording method using the information recording apparatus shown in FIG. 4.

FIG. 5 is a schematic view of an example of an information recording method using the information recording apparatus shown in FIG. 4.

As shown in FIG. 4, an information recording apparatus 60 has rollers 15a to 15d for conveying, e.g., the information recording medium 4' as shown in FIG. 2 to each means, a relief formation mechanism 12 for forming a relief pattern hologram, a resin film formation mechanism 13 for forming a resin film on the surface on which the relief pattern hologram is formed, and a refractive index change formation mechanism 14 for forming a refractive index change pattern hologram.

In this apparatus, the information recording medium 4' is first inserted into a tray (not shown), and conveyed to the relief formation mechanism 12 by the conveyor roller 15a. The relief formation mechanism 12 forms, e.g., a relief pattern hologram (S1). After that, the conveyor roller 15b conveys the information recording medium to the deformation preventing layer formation mechanism 13. The deformation preventing layer formation mechanism 13 coats the relief pattern hologram formation surface with a deformation preventing layer made of, e.g., a photo-setting resin (S2). The deformation preventing layer is then set by light irradiation (S3). Subsequently, the conveyor roller 15c conveys the information recording medium to the refractive index change formation mechanism 14. The refractive index change formation mechanism 14 forms a refractive index change pattern hologram (S4). After that, the conveyor roller 15d discharges the information recording medium to a tray (not shown). In this manner, the unrewritable relief pattern hologram 10 and rewritable refractive index change pattern hologram 9 are formed in the information recording medium 4.

Each of the above-mentioned mechanisms will be explained in more detail below.

FIG. 6 is a schematic view showing an example of the relief pattern formation mechanism shown in FIG. 4.

A light source 16 need only emit coherent light having a wavelength sensitive to an organic compound containing an azobenzene structure. In this mechanism, an oscillation line of 515 nm of an argon ion laser was used as highly coherent light. The laser beam from the light source 16 is transmitted through a half mirror 17, reflected by a mirror 18, converted into parallel light by a lens 19, and applied to a spatial optical modulator 20. A voltage address type liquid-crystal panel or the like can be used as the spatial optical modulator 20. A liquid-crystal layer of the spatial optical modulator can modulate the amplitude or intensity of incident light. A computer 23 converts information to be recorded in a relief hologram into a binary image made up of black and white dots. The image is output from the computer 23 to the spatial optical modulator 20, and displayed. In accordance with the information to be recorded, the intensity of light entering the spatial optical modulator 20 is two-dimensionally modulated. In this embodiment, the information to be recorded was an image obtained by downsizing the face image of the holder of the ID card. Then, the information recording medium 4 is irradiated with signal light that is the light whose intensity is two-dimensionally modulated in accordance with the information to be recorded.

On the other hand, the laser beam from the light source 16 is reflected by the half mirror 17 and a mirror 21, converted into parallel light by a lens 22, and applied as reference light to the information recording medium 4.

Consequently, the signal light and reference light interfere with each other, and the signal light holding the face image data is recorded as the relief pattern hologram 10. Note that the image information is displayed on the spatial optical modulator and the hologram is formed by using the information in this embodiment, but the present invention is not limited to this. An example is a computer generated hologram. That is, it is also possible to calculate interference fringes of light by a computer, and directly write the fringe pattern by a laser beam.

FIG. 7 is a schematic view showing an example of the refractive index change formation mechanism shown in FIG. 4.

A light source 24 need only emit coherent light having a wavelength sensitive to an organic compound containing an azobenzene structure. An oscillation line of 515 nm of an argon ion laser was used as highly coherent light in this mechanism as well. The laser beam from the light source 24 is transmitted through a half mirror 25, reflected by a mirror 26, converted into parallel light by a lens 27, and applied to a spatial optical modulator 28. A voltage address type liquid-crystal panel was used as the spatial optical modulator 28 as in the configuration shown in FIG. 6. A computer 23 converts information to be recorded in a refractive index change pattern hologram into a binary image made up of black and white dots. The image is output from the computer 23 to the spatial optical modulator 28, and displayed. In accordance with the information to be recorded, the intensity of light entering the spatial optical modulator 28 is two-dimensionally modulated. In this embodiment, the information to be recorded was a QR code image as a two-dimensional barcode obtained by converting the name, birth year/date, and ID number of the holder of the ID card into code information. Then, the information recording medium 4 is irradiated with signal light obtained by performing Fourier transform, by a Fourier transform lens 29, on the light whose intensity is two-dimensionally modulated in accordance with the information to be recorded.

On the other hand, the laser beam from the light source 24 is reflected by the half mirror 25 and a mirror 30, converted into parallel light by a lens 31, Fourier-transformed by a Fourier transform lens 32, and applied as reference light to the information recording medium 4.

Consequently, the signal light and reference light interfere with each other, and the signal light holding the QR code data is recorded as the refractive index change pattern hologram 9. Note that the image information is displayed on the spatial optical modulator and the hologram is formed by using the information in this embodiment, but the present invention is not limited to this. An example is a computer generated hologram. That is, it is also possible to calculate interference fringes of light by a computer, and directly write the fringe pattern by a laser beam.

When forming the refractive index change pattern hologram, the signal light and reference light described above can be applied from the surface opposite to the relief pattern hologram formation surface. Although the signal light and reference light may also be applied from the relief pattern hologram formation surface, the relief pattern may diffract the light and decrease the information recording efficiency.

FIG. 8 is a schematic view showing an example of the deformation preventing layer formation mechanism shown in FIG. 4.

Examples of the method of forming the deformation preventing layer on the surface of the relief pattern hologram 10 are flat screen printing, inkjet printing, and rubber roller printing. In this embodiment, inkjet printing was used.

FIG. 8 is a schematic view showing an example of the deformation preventing layer formation mechanism shown in FIG. 4.

An ink tank 34 is connected to an inkjet printing head 33, and a liquid prepared by dispersing an ultraviolet-curing resin in a solvent is placed in the ink tank 34. The inkjet printing head sprays droplets made of the ultraviolet-curing resin onto the relief pattern hologram 10 formation surface of the information recording medium, thereby forming a deformation preventing layer. This deformation preventing layer need only have a thickness with which the relief pattern is completely buried. In this embodiment, the thickness was 2 μm. An ultraviolet lamp 35 irradiates the ultraviolet-curing resin solution coating layer formation surface with ultraviolet radiation, thereby curing the ultraviolet-curing resin solution. In this way, the relief pattern hologram 10 can be fixed by the deformation preventing layer 11, and made unrewritable.

FIG. 9 is a schematic view of another example of the deformation preventing layer formation mechanism shown in FIG. 4.

This deformation preventing layer formation mechanism uses a thermosetting resin. An ink tank 34 is connected to an inkjet printing head 33, and a liquid prepared by dispersing a thermosetting resin in a solvent is placed in the ink tank 34. The inkjet printing head 33 sprays droplets made of the ultraviolet-curing resin onto the relief pattern hologram 10 formation surface of the information recording medium, thereby forming a deformation preventing layer. This deformation preventing layer need only have a thickness with which the relief pattern 10 is completely buried. In this embodiment, the thickness was 2 μm. The information recording medium 4 is sandwiched between a counter roller 37 and heat roller 36 such that the heat roller 36 comes in contact with the thermosetting resin coating layer formation surface, and the thermosetting resin coating layer is thermally set. In this manner, the relief pattern hologram 10 can be fixed by the deformation preventing layer 11, and made unrewritable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording medium manufacturing method, comprising:

forming, on a support, a recording layer containing a polymer compound which has an azobenzene structure and includes one of a compound represented by formula (2),

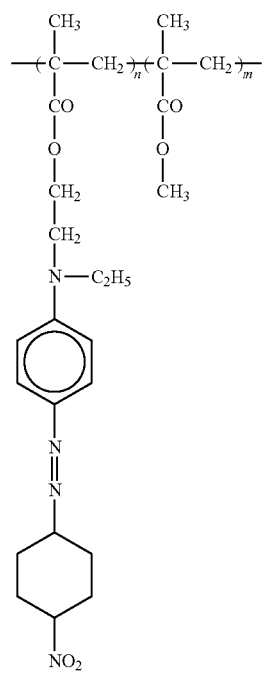

and Polyvinyl Alcohol containing dispersed methyl orange;

subsequently, irradiating a surface region of the recording layer with first writing light to move molecules of the polymer compound having the azobenzene structure thereby deforming the surface region of the recording layer and forming a first light-diffracting structure having a relief pattern due to movement of molecules on the surface of the recording layer;

subsequently, fixing the relief pattern by forming a deformation preventing layer on the surface of the recording layer; and subsequently, irradiating an inside region of the recording layer lower than the first light-diffracting structure having the fixed relief pattern with second writing light, thereby forming a second light-diffracting structure having a refractive index change in the inside region of the recording layer.

2. The method according to claim 1, wherein the first light-diffracting structure is visually readable.

3. The method according to claim 1, wherein the second light-diffracting structure is mechanically readable.

4. The method according to claim 1, wherein the deformation preventing layer contains a photo-setting resin.

5. The method according to claim 1, wherein the first light-diffracting structure is unrewritable and the second light-diffracting structure is rewritable.

6. The method according to claim 1, wherein the first light-diffracting structure is superposed on the second light-diffracting structure.

7. An information recording medium manufacturing method, comprising:

forming, on a support, a recording layer containing a polymer compound which has an azobenzene structure and includes one of a compound represented by formula (2),

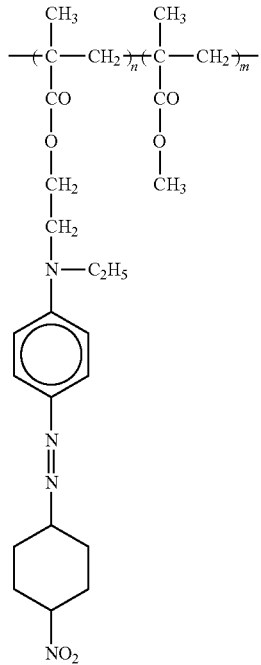

and Polyvinyl Alcohol containing dispersed methyl orange;

irradiating the recording layer with first writing light to move molecules of the polymer compound having the azobenzene structure for deforming a surface of the recording layer and forming a first light-diffracting structure having a relief pattern due to movement of molecules on the surface of the recording layer;

fixing the relief pattern by forming a deformation preventing layer on the surface of the recording layer, the deformation preventing layer containing a photo-setting resin; and irradiating the recording layer having the fixed relief pattern with second writing light, thereby forming a second light-diffracting structure having a refractive index change inside the recording layer.

8. The method according to claim 7, wherein the first light-diffracting structure is visually readable.

9. The method according to claim 7, wherein the second light-diffracting structure is mechanically readable.

10. An information recording medium manufacturing method comprising:

forming, on a support, a recording layer containing a polymer compound having an azobenzene structure;

subsequently, irradiating a surface region of the recording layer with first writing light to move molecules of the polymer compound having the azobenzene structure thereby deforming the surface region of the recording layer and forming a first light-diffracting structure having a non-leveled shape due to movement of molecules on the surface of the recording layer;

subsequently, fixing the non-leveled shape by forming a deformation preventing layer on the surface of the recording layer; and subsequently, irradiating an inside region of the recording layer lower than the first light-diffracting structure having the fixed non-leveled shape with second writing light, thereby forming a second light-diffracting structure having a refractive index change in the inside region of the recording layer.

11. The method according to claim 10, wherein the first light-diffracting structure is visually readable.

12. The method according to claim 10, wherein the second light-diffracting structure is mechanically readable.

13. The method according to claim 10, wherein the deformation preventing layer contains a photo-setting resin.

14. The method according to claim 10, wherein the first light-diffracting structure is unrewritable and the second light-diffracting structure is rewritable.

15. The method according to claim 10, wherein the first light-diffracting structure is superposed on the second light-diffracting structure.

* * * * *